United States Patent [19]

Casanova et al.

[11] Patent Number: 4,984,133
[45] Date of Patent: Jan. 8, 1991

[54] UNITIZED CENTRAL ELECTRONICS COMPLEX CONSTRUCTION

[75] Inventors: Wayne J. Casanova; Arthur P. Reckinger, Jr.; Michael D. Seyfert, all of Rochester; James R. Thorpe, Stewartville; Stephen E. Wheeler, Rochester, all of Minn.

[73] Assignee: International Business Machines Corporation, Armonk, N.Y.

[21] Appl. No.: 467,594

[22] Filed: Jan. 19, 1990

[51] Int. Cl.⁵ .............................................. H02B 1/02
[52] U.S. Cl. ................................. 361/415; 361/389
[58] Field of Search ............... 361/412, 413, 415, 394; 211/41; 439/65, 544

[56] References Cited

U.S. PATENT DOCUMENTS 3,733,523  5/1973  Reynolds et al. .................. 361/415
4,876,630  10/1989  Dara ................................... 361/413

Primary Examiner—Gerald P. Tolin
Assistant Examiner—Donald A. Sparks
Attorney, Agent, or Firm—Paul L. Sjoquist

[57] ABSTRACT

An enclosure is provided for containing the logic elements and ancillary components for computing systems. The enclosure is a unitized central electronics enclosure (CEC) wherein the primary structural element is the enclosure for the logic elements. This enclosure or logic cage includes unitary side plates, a double-sided backplane and top and bottom cast guides. The integrated structural and enclosure functions accommodate the structural needs of a CEC, as well as containing and supporting the logic elements and ancillary equipment.

4 Claims, 2 Drawing Sheets

UNITIZED CENTRAL ELECTRONICS COMPLEX CONSTRUCTION

BACKGROUND OF THE INVENTION

This invention relates generally to enclosures for containing and supporting logic elements and ancillary equipment for computing systems and, more particularly, to a central electronics complex (CEC) for electronic or computer components that directly receives a plurality of logic elements and other components, e.g., blowers or other ancillary components, wherein the enclosure itself is the primary structural element.

Typically, the construction of a central electronics complex (CEC) containing the logic elements and other components for use in computing systems may be described as a "cage-within-a-cage". An enclosure or mounting container is the primary structural element and that enclosure contains an independently constructed or formed logic cage and other hardware which might include blower assemblies, plenums, or other ancillary equipment.

This type of construction has created, or at least failed to solve, a number of problems. First, the complexity of the cage-within-a-cage type of CEC is extreme because mounting points for the logic elements and other components, as well as the mechanical interface to the rest of the system, must be provided. Strict tolerances must be observed and many separately configured details, mounting considerations and separate welded items or features are required. Tooling expenses for the separate multi-part enclosure that is used to contain the logic cage and other ancillary equipment are high due to size and complexity.

Secondly, the typically constructed CEC is not very flexible. The requirement that different ancillary components be used as computing systems evolve means that the separate multi-part enclosure, as the primary structural element of a CEC, must undergo frequent significant redesign which in turn results in increased part numbers and additional tooling costs. Also, the ability to be used in different computing systems or to be attractively covered to act as a stand alone unit is limited because it is difficult to design multiple mounting configurations for the enclosure. Differing mounts and different required equipment typically require a redesign of the basic enclosure, as well as additional parts.

Known enclosures impose significant space limitations. This is exacerbated by the cage-within-a-cage or double wall construction. Space that could be used for additional logic elements or for ancillary equipment is unavailable.

Using a separate multi-part enclosure for the basic structural element of a CEC results in increased weight causing shock and vibration concerns in addition to increased handling difficulty. Additionally, the separate multi-part enclosure is usually quite complex as a result of required ancillary equipment; this usually precludes assembling the CEC at the point of use.

There have been attempts to address these problems in the prior art. The following patents disclose various enclosures for logic elements and other external hardware: 4,232,356; 4,447,856; 3,184,645; 3,452,148; 3,191,097 and 4,287,764.

U.S. Pat. No. 4,356,531 discloses a computer housing which has walls that form a cage for receiving cards and a fan module. The housing includes jig means for precise assembly of the walls and the walls are adapted to receive modules. The housing includes mechanical interconnection and the sidewalls are reversible.

U.S. Pat. No. 4,672,509 discloses an air cooling assembly in an electronic system enclosure wherein a cabinet with sides and a backplane is provided. Upper and lower racks, connected by screws through the sides of the cabinet, are provided for supporting a plurality of logic modules. A method of attaching the top and bottom plenum and/or support members is also disclosed.

The above cited prior art, while representing significant advances in CEC construction, leaves several problems unresolved: it is still difficult to mount a cage structure in a standard EIA rack or other enclosure without extra hardware; the capacity to be configured or reconfigured as a stand-alone logic cage having attractive covers is not addressed; ancillary equipment cannot be accommodated without changing the entire basic cage structure itself; valuable space is wasted by the cage-within-a-cage construction; and there is no construction method disclosed wherein the enclosure or cage for the logic elements becomes the primary structural element for the CEC and provides the required rigidity for accepting external devices and mounting the CEC.

SUMMARY OF THE INVENTION

The present invention is directed to and in large part solves the problems discussed above.

An enclosure is provided for containing the logic elements and ancillary components for computing systems. The enclosure is a unitized central electronics enclosure (CEC) wherein the primary structural element is the enclosure or cage for the logic elements. This enclosure or logic cage includes unitary side plates, a double-sided backplane and top and bottom guides. The integrated structural and enclosure functions accommodate both the structural needs of a CEC, as well as containing and supporting the logic elements and ancillary equipment.

It is a specific object of the present invention to diminish the complexity and cost of CECs by eliminating the inefficient cage-within-a-cage requirement.

It is another object of the present invention to provide a CEC which enhances the flexibility of CECs whereby changes in the numbers of logic elements contained therein or in the type and number of ancillary equipment required thereby are easily accommodated.

It is another object of the present invention to provide a CEC wherein there is more efficient use of space to accommodate an increased number of logic elements.

Yet another object of the present invention is to provide a CEC which is resistant to stress, shock and the vibration in shipping, handling and operational situations.

Advantages of the CEC of the present invention are that it is substantially less complex than prior art enclosures, it is more flexible in terms of changing or adding items of ancillary equipment and simplicity of the construction permits the CEC to be constructed and tested away from the original in-plant manufacturing site.

Further objects, features and advantages of the present invention will be understood with reference to the following specification, the appended drawings and the claims.

DETAILED DESCRIPTION OF THE PRESENT INVENTION

Figure 1:
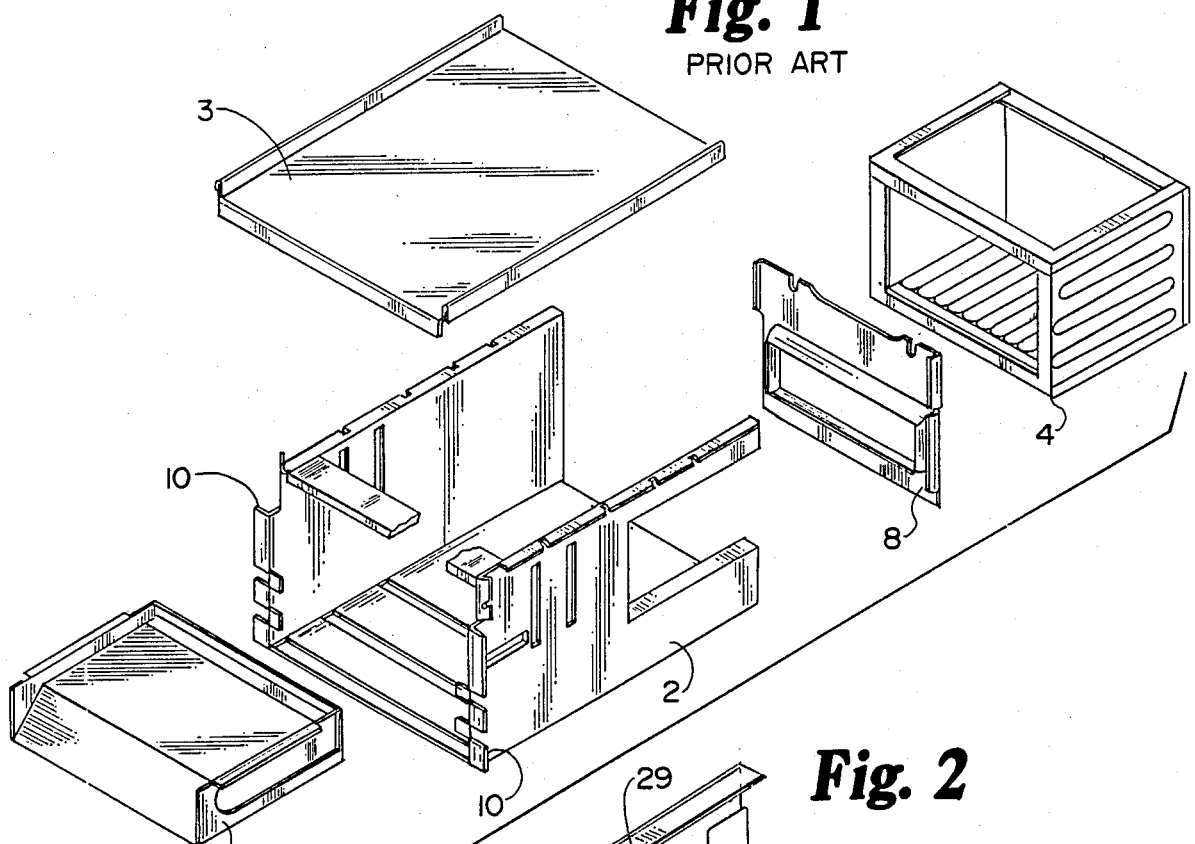
FIG. 1 is an exploded perspective view of a prior art central electronics complex.

FIG. 1 shows a typically constructed prior art central electronics complex (CEC). The CEC is made up of an enclosure 2 having an enclosure cover 3. A logic cage 4 is mounted in enclosure 2. The enclosure 2 is designed to support and contain a blower assembly 6 and a plenum 8. Tabs 10 are provided for affixing the central enclosure to a rack or other mounting system (not shown). The enclosure 2 is the primary structural element and the major mechanical interface to the rest of the computing system, as well as between the various components identified herein above.

Figure 2:
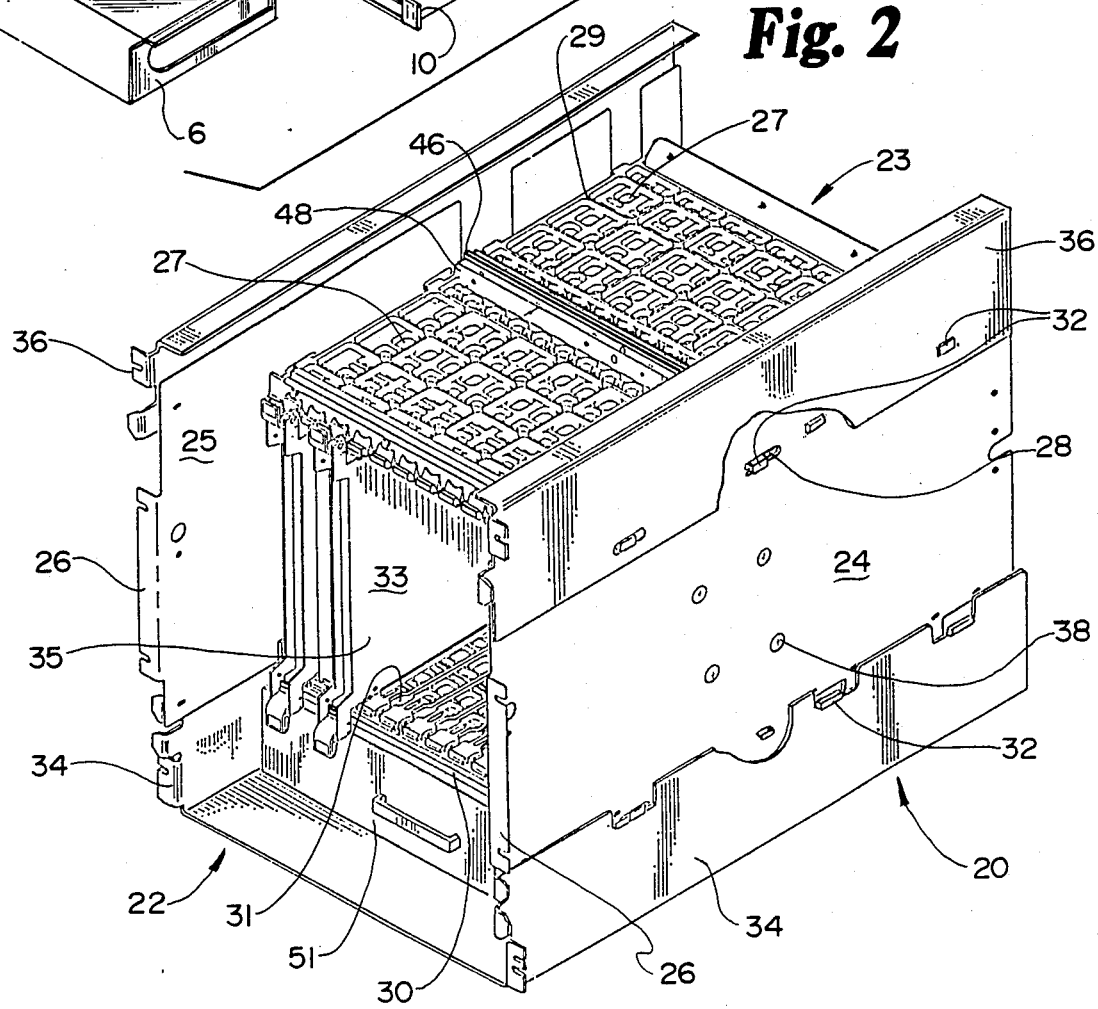
FIG. 2 is a perspective view of the central electronics complex of the present invention.
Figure 4:
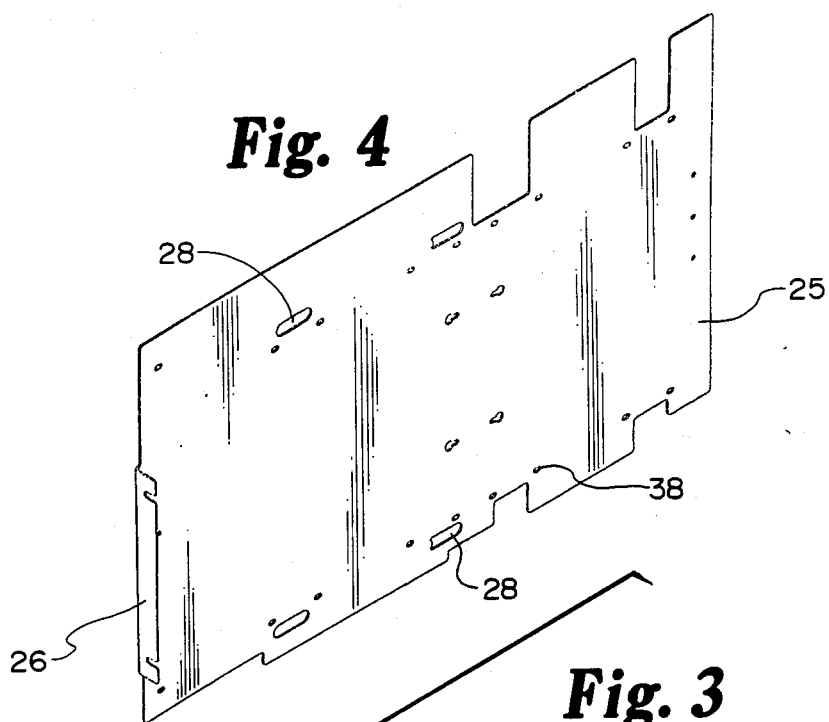
FIG. 4 is a perspective view of a side plate used in constructing the central electronics complex of the present invention.
Figure 3:
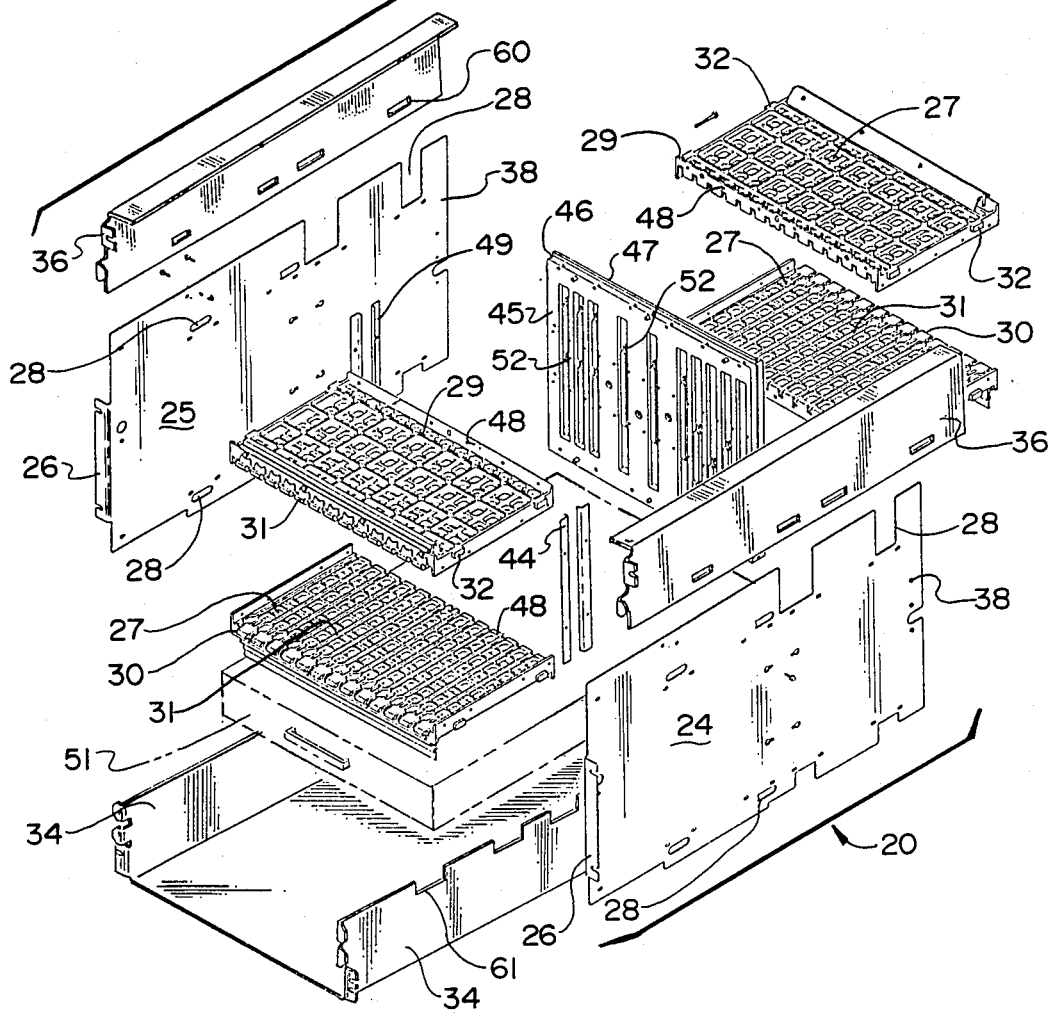
FIG. 3 is an exploded perspective view of the central electronics complex of the present invention.

FIGS. 2 and 3 depict the unitized central electronics complex (CEC) of the present invention. The CEC is indicated generally at 20 and includes logic cages 22, 23. The basic structural element of the present invention is side plate 24, 25. The side plates 24, 25 are provided with flanges 26 which are integrally formed and are provided to mount the CEC 20 in a typical EIA rack or other mounting system. The side plates 24, 25 have alignment apertures 28 and may be provided with additional apertures 38 for conventional fastening means. It should be noted that side plates 24, 25 are each formed of single pieces of sheet metal (see FIG. 4) and are mirror images of each other. This represents a substantial improvement over the prior art in terms of both cost savings and ease of assembly. Also, overall CEC 20 rigidity and tolerance control are improved.

The CEC 20 of the present invention includes top and bottom guides 29, 30 which may be cast or may be formed by other suitable material or processes. The guides 29, 30 are planar and each has an arrangement of many generally rectangular openings 27. Guide slots 31 are provided for guiding and supporting logic elements 33 within the sub-cages 22, 23. It should be understood that the logic elements 33 have solid sides 35 and shown) which line up with the openings 27 on the guides 29, 30 when the elements 33 are fully inserted in sub-cages 22, 23.

The guides 29, 30 are provided with alignment tabs 32. In FIG. 2, the alignment of the guides 29, 30, parts 34 and 36 and side plates 24, 25 can be seen. The advantages provided thereby: standardized production, ease of assembly and alignment and improved structural rigidity, may be appreciated by examining that figure.

The sub-cages 22, 23 share a common double-sided backplane assembly 46, described in greater detail in the commonly assigned copending application entitled DOUBLE-SIDED BACKPLANE ASSEMBLY, by Aug et al. The backplane assembly 46 has a front side 45 and a back side 47 which face sub-cage 22, 23, respectively. Each side 45, 47 has connectors 52 so that logic elements 33 may be connected to both sides 45, 47. The backplane assembly 46 is mounted between the sub-cages 22, 23 by attaching it with conventional attachment means (not shown) to the guides 29, 30 along integral bars 48. Additionally, the backplane assembly 46 may be positioned or secured at side plates 24, 25 by parallel, vertical mounting gussets 49.

Sheet metal adjuncts 34, 36 of low complexity are provided for mounting or attaching ancillary pieces of equipment as required. For example, the sheet metal adjuncts 34, 36 may be used to integrate a blower assembly 51 into the CEC 20 or to form the top and bottom enclosing walls for a CEC if required by a specific function. The alignment of sheet metal adjuncts 34, 36 is accomplished by abutting specific edges of apertures 60, 61 to the mating surfaces of guide 29, 30 of tabs 32.

It should be noted, as shown in FIGS. 2 and 3, that the CEC 20 of the present invention is a double-sided or dual CEC. That is, the CEC 20 provides a double-sided enclosure made up of sub-cages 22, 23. The side plates 24, 25 extend for the length of both sub-cages 22, 23. This substantially improves the cage 22 to cage 23 alignment as well as the overall rigidity and resistance to vibration exhibited by the CEC 20. Additionally, the CEC 20 is easily adapted to a variety of uses and configurations simply by using different adjuncts 34, 36; the CEC 20 does not have to be fundamentally redesigned to be used with various ancillary equipment.

The present invention may be embodied in other specific forms without departing from the spirit or essential attributes thereof. Therefore, the present described embodiment should be considered as illustrative, not restrictive. Reference should be made to the appended claims rather than to the foregoing description to indicate or perceive the scope of the invention.

What is claimed:

1. A central electronic complex having two back-to-back logic cages, said complex for containing logic elements and ancillary equipment for computing systems, said complex comprising:
   a. two spaced, opposed side plates forming the sidewalls of said complex, said side plates having a plurality of in-line alignment apertures along upper and lower regions thereof,
   b. first upper and lower guides having projecting tabs engaged in certain of said apertures of said side plates, said guides being spaced vertically and parallel relative to one another and affixed between said side plates generally perpendicularly thereto to form the upper and lower guide means for receiving logic elements; said first upper and lower guides cooperating with said side plates to form a first logic cage;
   c. second upper and lower guides having projecting tabs engaged in further of said apertures of said side plates, said guides being spaced vertically and parallel relative to one another and affixed between said side plates generally perpendicularly thereto to form the upper and lower guide means for receiving logic elements; said second upper and lower guides cooperating with said side plates to form a second logic cage; and
   d. a backplane assembly affixed between said first and second logic cages, said backplane assembly having front and rear sides, each side having a plurality of connectors for conductively receiving said logic elements.

2. The complex of claim 1, wherein said side plates extend continuously along the length of said complex.

3. The complex of claim 2, wherein said guides have an array of openings extending therethrough for passage of air.

4. The apparatus of claim 1, further, comprising an ancillary equipment enclosure having a horizontal segment and vertical wall segments extending therefrom, and means for attaching each of said vertical wall segments to one of said side plates.

* * * * *

UNITED STATES PATENT AND TRADEMARK OFFICE
CERTIFICATE OF CORRECTION

PATENT NO. : 4,984,133

DATED : January 8, 1991

INVENTOR(S) : Wayne J. Casanova, et al

It is certified that error appears in the above-identified patent and that said Letters Patent is hereby corrected as shown below:

In column 3, line 48, after "and" insert -- on their top and bottom edges have openings (not --.

Signed and Sealed this

Twelfth Day of May, 1992

Attest:

DOUGLAS B. COMER

*Attesting Officer*     *Acting Commissioner of Patents and Trademarks*